US006838721B2

(12) United States Patent
Garni et al.

(10) Patent No.: US 6,838,721 B2
(45) Date of Patent: Jan. 4, 2005

(54) INTEGRATED CIRCUIT WITH A TRANSITOR OVER AN INTERCONNECT LAYER

(75) Inventors: Bradley J. Garni, Austin, TX (US); Perry H. Pelley, III, Austin, TX (US)

(73) Assignee: Freescale Semiconductor, Inc., Austin, TX (US)

(*) Notice: Subject to any disclaimer, the term of this patent is extended or adjusted under 35 U.S.C. 154(b) by 0 days.

(21) Appl. No.: 10/423,589

(22) Filed: Apr. 25, 2003

(65) Prior Publication Data

US 2004/0211963 A1 Oct. 28, 2004

(51) Int. Cl.[7] .......................................... H01L 27/108
(52) U.S. Cl. ................. 257/296; 257/326; 257/532; 257/758
(58) Field of Search ............................. 257/296, 326, 257/532, 734, 758

(56) References Cited

U.S. PATENT DOCUMENTS

| | | | |
|---|---|---|---|
| 6,185,143 B1 | 2/2001 | Perner et al. | |
| 6,242,770 B1 | 6/2001 | Bronner et al. | |
| 6,256,247 B1 | 7/2001 | Perner | |
| 6,355,950 B1 * | 3/2002 | Livengood et al. | 257/276 |
| 6,574,130 B2 * | 6/2003 | Segal et al. | 365/129 |
| 6,583,045 B1 * | 6/2003 | Liu et al. | 438/620 |
| 6,664,613 B2 * | 12/2003 | Tuttle | 257/659 |
| 2001/0005019 A1 * | 6/2001 | Ishikawa | 257/59 |

OTHER PUBLICATIONS

U.S. patent application S/N 10/185,566 entitled "Sense Amplifier and Method for Performing a Read Operation in a MRAM," filed Jun. 28, 2002 and assignee hereof.

U.S. patent application S/N 10/331,058 entitled "Method and Apparatus for Compensating Deviation Variances in a 2–Level FSK FM Transmitter," filed Dec. 27, 2002 and assignee hereof.

Lee et al., "Low–temperature polysilicon TFT with counter–doped lateral body terminal," *Electronics Letters*, Feb. 28, 2002, vol. 38, No. 5, pp. 255–256.

Moon et al., "Improvement of Polycrystalline Silicon Thin Film Transistor Using Oxygen Plasma Pretreatment Before Laser Crystallization," *IEEE Transactions on Electron Devices*, Jul. 2002, vol. 49, No. 7, pp. 1319–1322.

Rezaee et al., "Low temperature polysilicon growth on glass suitable for TFT fabrication," *The 13th Conference on Microelectronics*, Rabat, Morocco, Oct. 29–31, 2001, pp. 79–82.

Sazonov, et al., "Low Temperature a–Si:H TFT on Plastic Films: Materials and Fabrication Aspects," *Proc. 23rd International Conference on Microelectronics (MIEL 2002)*, Nis, Yugoslavia, May 12–15, 2002, vol. 2, pp. 525–528.

* cited by examiner

Primary Examiner—T. N. Quach
(74) Attorney, Agent, or Firm—David G. Dolezal; Daniel D. Hill

(57) ABSTRACT

An integrated circuit (101) includes electrical circuitry (105) formed on a substrate (103). An interconnect layer (109, 117) is formed over the electrical circuitry (105). In one example, a plurality of magneto-resistive random access memory cells (MRAM) (161, 171) is implemented above the interconnect layer. Each of the MRAM cells comprises a magneto-resistive tunnel junction (MTJ) storage element. A transistor (130) is formed-over the interconnect layer (109, 117). In one embodiment, the transistor is implemented as a thin film transistor (TFT). In one embodiment the transistor is a select transistor and may be coupled to one or more of the MTJ storage elements. Access circuitry (203, 205, 207, 209) is formed on the substrate (103) under the plurality of MRAM cells (161, 171).

22 Claims, 2 Drawing Sheets

US 6,838,721 B2

INTEGRATED CIRCUIT WITH A TRANSITOR OVER AN INTERCONNECT LAYER

BACKGROUND OF THE INVENTION

1. Field of the Invention

This invention relates in general to integrated circuits and more specifically to transistors formed over an interconnect layer of an integrated circuit.

2. Description of the Related Art

Transistors formed on a semiconductor substrate are utilized to implement circuitry of an integrated circuit. The size of the transistors, the area of substrate space available, and the interconnect structures (e.g. interconnects and vias) needed for the circuitry limit the circuit density of an integrated circuit.

One type of integrated circuit includes a memory array of magneto-resistive Random Access Memory (MRAM) cells formed above interconnect and insulating layers of an integrated circuit. These cells are coupled to access circuitry formed on the substrate of the integrated circuit. An example of an access circuit is a select transistor utilized for a selective read access of an MRAM cell. Typically, this select transistor is located on the substrate. The path between an MRAM cell and a select transistor includes interconnect structures in the interconnect and insulating layers.

Accordingly, implementing a select transistor on the substrate not only requires the utilization of substrate space, but also the utilization of space in the interconnect and insulating layers. What is desired is an improved integrated circuit that allows for a greater density of circuitry.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. FIGS. 1 and 2 are not necessarily drawn to scale.

DETAILED DESCRIPTION

The following sets forth a detailed description of a mode for carrying out the invention. The description is intended to be illustrative of the invention and should not be taken to be limiting.

Figure 1:
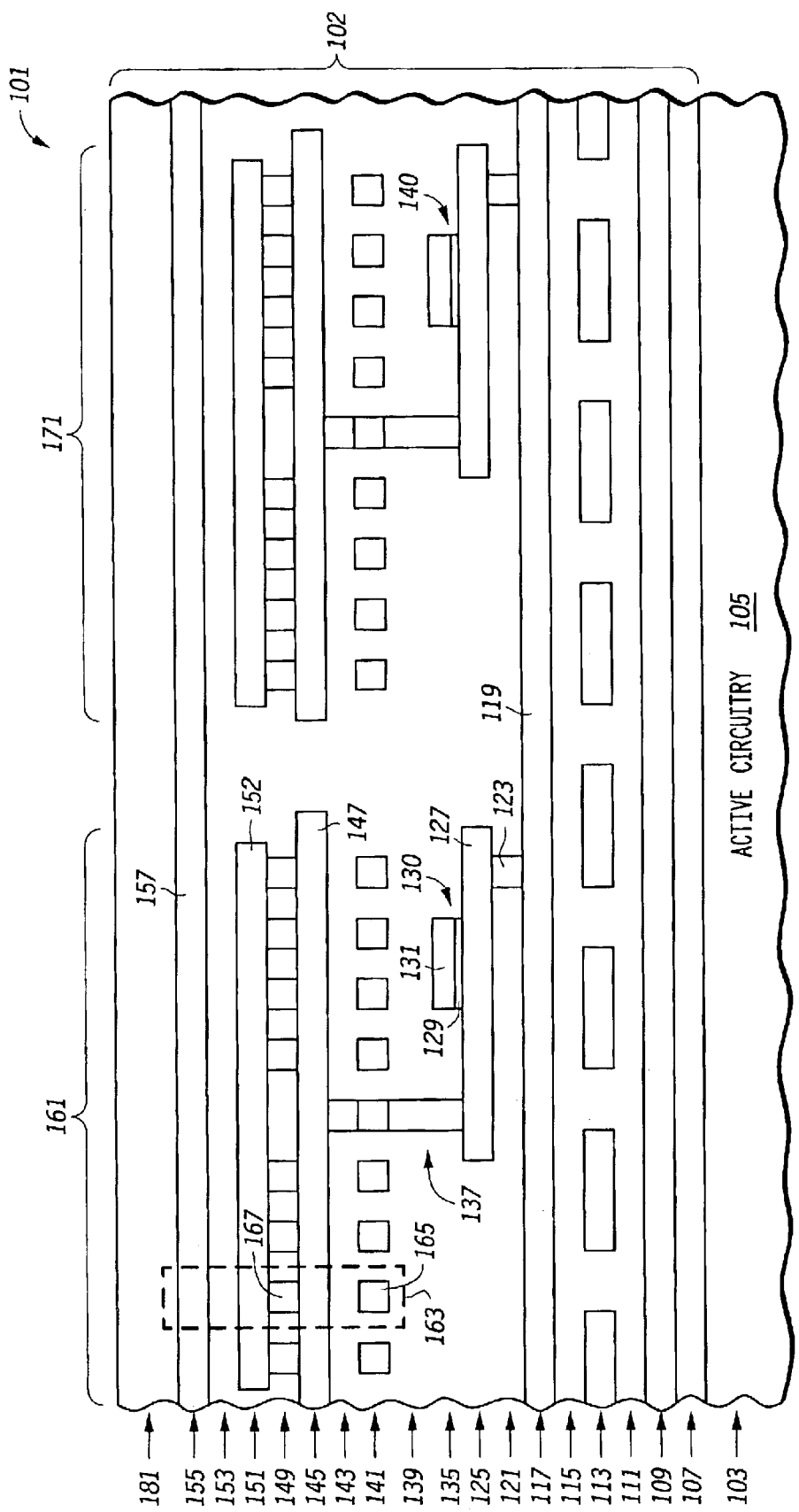
FIG. 1 is a partial side cross sectional view of one embodiment of an integrated circuit according to the present invention.

FIG. 1 shows a partial side cross sectional view of one embodiment of an integrated circuit according to the present invention. Integrated circuit 101 has a semiconductor substrate 103 that includes active circuitry 105 formed thereon. In one embodiment, active circuitry 105 includes circuitry implemented with transistors (e.g. CMOS) formed on substrate 103. In an embodiment utilizing conventional CMOS transistors, the source/drain regions (not shown) of the CMOS transistors are formed by doping the semiconductor substrate material and the gates of the CMOS transistors are formed by depositing a polysilicon layer over the substrate material and selectively etching the deposited layer. However, active circuitry of other integrated circuit embodiments may include other types of transistors having other configurations formed on substrate 103.

Located over substrate 103 are a plurality of interconnect and insulating layers 102 (plurality of layers 102). Plurality of layers 102 includes conductive structures for coupling signal and power to active circuitry 105 and to external connectors (e.g. bond pads (not shown)) of integrated circuit 101. In the embodiment shown, integrated circuit 101 includes a memory array with a plurality of memory cell groups (e.g. cell groups 161 and 171) formed in the plurality of interconnect and insulting layers 102. In the embodiment shown, memory cell groups 161 and 171 each include eight Magneto-resistive Random Access Memory (MRAM) cells.

In the embodiment shown, each MRAM cell (e.g. 163) includes a magneto tunnel junction (MTJ) stack (e.g. 167) located in stack layer 149 of the plurality of layers 102. In one embodiment, each MTJ stack includes a fixed magnetic layer (e.g. made of nickel iron), a tunnel junction (e.g. a dielectric) located over the fixed magnetic layer, and a free magnetic layer (e.g. made of nickel iron) over the tunnel junction. The fixed magnetic layer of each cell is connected to a local interconnect (e.g. 147), and the free magnetic layer of each cell is connected to a local interconnect (e.g. 152) which is coupled to ground (Vss). For each memory cell, a first write line. (e.g. 157) located in final metal interconnect layer 155 passes directly over the MTJ stack (e.g. 167) of the cell in a first direction and a second write line (e.g. 165) located in metal interconnect layer 141 pass directly under the MTJ stack (e.g. 167) in a second direction perpendicular to the first direction. In one embodiment, the write lines (e.g. 157 and 165) are made of copper. In other embodiments, MRAM cells of other configurations maybe utilized.

The MTJ stack (e.g. 167) of each MRAM cell (e.g. 163) is utilized as an MTJ storage element for storing a bit of data. The resistance of the tunnel junction of the MTJ stack is indicative of the value of the bit stored. In one embodiment, the resistance of the tunnel junction is a function of the alignment of the magnetic dipole in the free layer of the MTJ stack (e.g. 167) relative to the alignment of the magnetic dipole of the fixed layer of the MTJ stack. If the free layer's magnetic dipole of a cell is aligned parallel to the fixed layer's magnetic dipole, then the tunnel junction resistance will be at a low level. If the free layer's magnetic dipole is aligned anti-parallel to the fixed layer's magnetic dipole, then the tunnel junction resistance will be at a higher level. The dipole of the free layer may be rotated by application of high currents through the write lines directly above and below the MTJ stack of a cell. Each write to a cell toggles the logic state of the bit stored in the cell. Other embodiments may include MRAM cells of other configurations and/or that operate in other manners. The data bit stored in each cell can be determined by measuring the resistance of the tunnel junction. In one embodiment, the state of the bit is determined by comparing the resistance of the tunnel junction to a known reference resistance. In one embodiment, the state of the bit stored in an MRAM cell is read by changing the resistance of the tunnel junction of the MTJ stack and measuring the increase or decrease in resistance. Other types of MRAM cells may include MTJ storage elements of other configuration.

Integrated circuit 101 includes a plurality of transistors (e.g. 130) formed in the plurality of layers 102. Transistor 130 serves as a select transistor to selectively couple interconnect 147 to bitline 119, which is located in metal interconnect layer 117. In one embodiment transistor 130 is a thin film transistor. A thin film transistor is a transistor having a body region formed from a layer of semiconductor material. The current electrodes (e.g. the source and drain regions for a CMOS transistor) of transistor 130 are formed in body portion 127 of layer 125. A gate dielectric 129 is formed on portion 127. Wordline 131, which is located in interconnect layer 135, includes a portion located over portion 127 that serves as the control electrode (e.g., a gate for a CMOS transistor) for transistor 130. A via stack 137 extends from a source/drain region of body portion 127 to interconnect 147 through interconnect layer 135, insulating layer 139, interconnect layer 141, and insulating layer 143. Transistor 130 is made conductive by applying a voltage to wordline 131 that is greater than the threshold voltage of transistor 130. Bitline 119 is coupled to active circuitry 105 by, in one embodiment, a via stack (not shown) through insulating layer 115, metal interconnect layer 113, insulating layer 111, metal interconnect layer 109, and insulating layer 107. Accordingly, placing transistor 130 in a conductive state couples the memory cells of memory cell group 161 to active circuitry 105 in substrate 103. In some embodiments, the coupling of bitline 119 to active circuitry 105 may include interconnect structures in interconnect layers 109 and 113, wherein the via in layer 121 is offset from the via in layer 107. In other embodiments, bitline 119 may be coupled to active circuitry 105 by other transistors located in plurality of layers 102.

In one embodiment, body portion 127 is formed by depositing a layer of amorphous silicon over insulating layer 121. In one embodiment, the layer of amorphous silicon is in the range of 500–1000 angstroms, but in other embodiments, may be thinner or thicker. The amorphous silicon is then recrystallized (e.g. by laser annealing in a vacuum chamber). The recrystallized polysilicon layer is then patterned to form the body portions (e.g. 127) of the select transistors (e.g. 130 and 140). The gate insulator layer is then deposited on the wafer including on the body portion e.g. TEOS by a plasma enhanced chemical vapor deposition. Aluminum is deposited over the gate insulator layer and patterned and etched to form the wordline (e.g. wordline 131). In some embodiments, wordline 131 may be formed from polysilicon. In one embodiment, the gate insulator is also etched during the etching of the wordlines of the select transistors. However, in other embodiments, the gate insulator layer is not patterned and etched. After the wordline (e.g. 131) has been etched, the source and drain regions are doped (in some embodiments through the layer of gate insulating material). A layer of insulating material is then deposited over the previously formed layer of plurality of layers 102 including over the body portions and wordlines. The layer of insulation is polished to planarize the top surface of insulating layer 139. The insulating material is then patterned to form an opening to the body regions (e.g. 127) for forming the vias of the via stacks (e.g. 137). The other layers of the plurality of layers 102 (including passivation layer 181) are then formed. In some embodiments, bond pads (not shown) are formed in final metal interconnect layer 155.

In one embodiment, the select transistors (e.g. 130) are formed by processes at temperatures equal to or less than 450 C. Still in other embodiments, the select transistors are formed by processes at temperatures equal to or less than 250 C.

Providing an integrated circuit with transistors over an interconnect layer may provide for an integrated circuit with a higher circuit density. For example, locating the select transistors of an MRAM memory device in the plurality of layers may increase the density of the integrated circuit implementing the MRAM memory device. If select transistor 130 were located on substrate 103, not only would space on substrate 103 be taken for the select transistor, but also space in the plurality of layers 102 would be needed to couple bitline 119 to the select transistor on the substrate and to couple the select transistor in the substrate to cell group 161. Also, locating the transistor over an interconnect layer may allow for that portion of the interconnect layer located below the transistor to be coupled to active circuitry formed on the substrate below the interconnect layer, thereby allowing for the use of the substrate for active circuitry in some embodiments. Accordingly, locating the select transistors over an interconnect layer in the plurality of layers 102 may free up space in the substrate beneath the memory array for other circuitry such as for other access circuitry (e.g. drivers, select circuitry, and sense amplifiers), random logic, or circuitry of other devices of the integrated circuit. It also saves space in plurality of layers 102.

Figure 2:
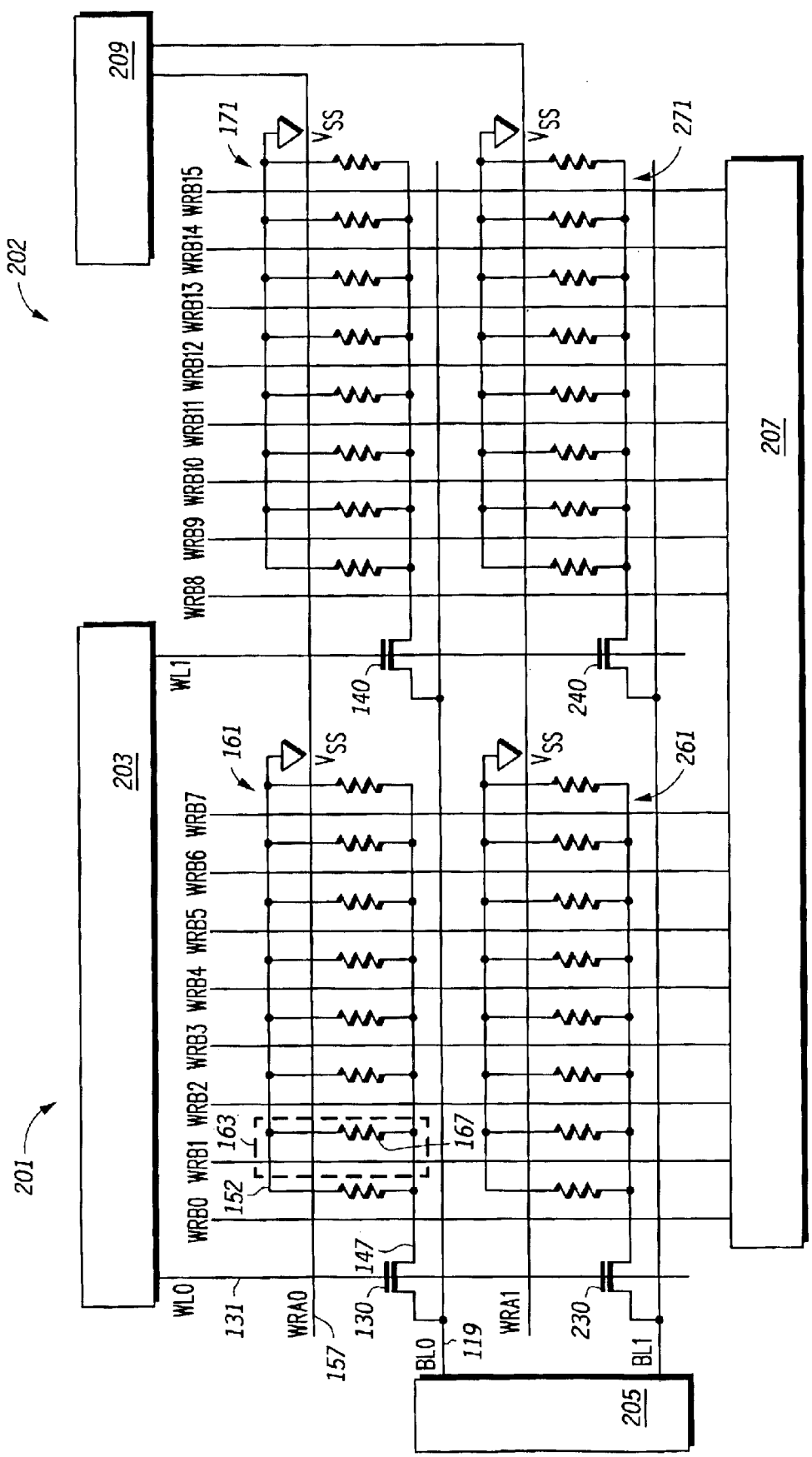
FIG. 2 is a circuit diagram of an embodiment of a memory device according to the present invention.

FIG. 2 is a schematic diagram of a portion of a memory device that implements the circuitry shown in FIG. 1. Memory device 201 includes access circuitry such as column select 205, wordline drivers 203, write drivers 207, write drivers 209, sense amplifiers (not shown), and select transistors (e.g. 130 and 140). In one embodiment, the access circuitry (except for the select transistors) is implemented in active circuitry 105 on substrate 103. Memory device 201 includes a memory array 202 having multiple cell groups with cell groups 161, 171, 261, and 271 shown in FIG. 2. In the embodiment shown, each cell group includes eight MRAM cells (e.g. 163) with each cell having an MTJ stack 167 which is utilized as an MTJ storage element. The MRAM cells of cell group 161 are selectively coupled to bitline BL0 by select transistor 130, and the MRAM cells of cell group 171 are selectively coupled to bitline BL0 by select transistor 140. The MRAM cells of cell group 261 are selectively coupled to bitline BL1 by select transistor 230, and the MRAM cells of cell group 271 are selectively coupled to bitline BL1 by select transistor 240. Bitline BL0 119 and bitline BL1 are coupled to column select 205. Memory device 201 also includes other bitlines (not shown) coupled to column select 205. Column select 205 is coupled to a sense amplifier (not shown) for providing an indication of the resistive state of the MRAM memory cells. In other embodiments, the cell groups have a different number of cells such as, e.g., 1, 12, or 16 cells per group.

Write driver 207 controls write lines WRB0–WRB15 and write driver 209 controls write lines WRA0 and WRA1. Write lines WRB0–WRB7 each extend directly under an MTJ stack of an MRAM cell of cell group 161 and an MTJ stack of an MRAM cell of cell group 261. Write lines WRB8–WRB15 each extend directly under an MTJ stack of an MRAM cell of cell group 171 and an MTJ stack of an MRAM cell of cell group 271. Write line WRA0 extends directly over each of the MTJ stacks of the MRAM cells of cell group 161 and of cell group 171, and WRA1 extends directly over each of the MTJ stacks of the MRAM cells of cell group 261 and of cell group 271. For example, WRB1 extends directly under MTJ stack 167 of MRAM cell 163 and WRA0 extends directly over MTJ stack 167 of MRAM cell 163.

Wordline driver 203 controls the voltage of wordlines WL0 and WL1. Each wordline controls the select transistors (e.g. 130 and 140) for enabling a read of the MRAM cells of a cell group. In one embodiment, to read an MRAM cell of a cell group, the select transistor (e.g. 130) is activated with a select signal on a wordline (e.g. 131) to couple the cell groups (e.g. 161) to a data path coupled to a sense amplifier (not shown), wherein the current of the data path is read by the sense amplifier. In the embodiment shown, the data path includes the bitline (e.g. 119) coupled the select transistor being activated. In one embodiment, the bit is then written to toggle the state of the MTJ storage element. A second read of the data path is made with the select transistor activated. The first reading is compared with the second reading to determine whether the cell being read was at a high state or a low state prior to being toggled. Afterwards the MRAM cell is written again to return the MTJ storage element to its original MRAM state.

In some embodiments, memory device 201 is an embedded memory e.g. for an MPU, CPU, DSP, ASICS, or other type of device. In other embodiments, memory device 201 is implemented as a stand alone memory.

In other embodiments, other transistors of the access circuitry (e.g. 205, 203, 207 and 209) of memory device 201 may be located above an interconnect layer. Also, in other embodiments, memory devices that include access circuitry transistors located above an interconnect layer may have other configurations, other types of access circuitry, and/or have other types of memory cells. For example, in some embodiments, a memory device may include a select transistor for each memory cell.

Also, transistors located above an interconnect layer may be implemented in other types of integrated circuits such as, e.g., logic circuits used to build memory control circuits or other types of logic circuitry for processors, ASICS, or programmable arrays.

In one aspect of the invention, an integrated circuit includes a substrate having an electrical circuit formed thereon, an interconnect layer formed over the electrical circuit, and a thin film transistor (TFT) formed over the interconnect layer.

In another aspect of the invention, an integrated circuit includes a substrate having active circuitry formed thereon, an interconnect layer formed over the substrate, a plurality of memory cells formed over the interconnect layer, and a transistor formed over the interconnect layer. The transistor is for selectively coupling a memory cell of the plurality of memory cells to the active circuitry.

In another aspect, the invention includes a method for forming an integrated circuit. The method includes providing a substrate, forming an electrical circuit on the substrate, forming an interconnect layer over the electrical circuit, and forming a thin film transistor (TFT) over the interconnect layer.

In another aspect, the invention includes a method for forming an integrated circuit. The method includes providing a substrate, forming active circuitry on the substrate, and forming an interconnect layer over the substrate. The method also includes forming a plurality of memory cells over the interconnect layer and forming a transistor over the interconnect layer. The transistor is for selectively coupling a memory cell of the plurality of memory cells to the active circuitry.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. An integrated circuit comprising:
   a substrate having an electrical circuit formed thereon;
   an interconnect layer formed over the electrical circuit; and
   a thin film transistor (TFT) formed over the interconnect layer;
   wherein the integrated circuit includes a memory having a plurality of memory cells and the electrical circuit is an access circuit for accessing the plurality of memory cells.

2. The integrated circuit of claim 1, wherein the thin film transistor is for coupling at least one of the plurality of memory cells to a data path in response to receiving a select signal from the access circuit.

3. The integrated circuit of claim 1, wherein the plurality of memory cells is characterized as being a plurality of magneto-resistive random access memory (MRAM) cells, each of the plurality of MRAM cells comprising a magneto tunnel junction (MTJ) storage element.

4. The integrated circuit of claim 3, wherein a group of the plurality of MRAM cells is coupled to the thin film transistor.

5. The integrated circuit of claim 3, wherein:
   the thin film transistor is for coupling at least one of the plurality of memory cells to a data path in response to receiving a select signal from the access circuit;
   the thin film transistor has a first current electrode coupled to an MTJ storage element of the at least one of the plurality of memory cells, a second current electrode coupled to a bitline, and a control electrode coupled to a wordline for receiving the select signal.

6. The integrated circuit of claim 5, wherein the thin film transistor is coupled to an MTJ storage element of more ta one of the plurality of memory cells.

7. The integrated circuit of claim 6, wherein the MTJ storage elements of the more than one of the plurality of memory cells are coupled together in parallel.

8. The integrated circuit of claim 1, wherein the interconnect layer is one of a plurality of metal interconnect layers formed over the electrical circuit.

9. The integrated circuit of claim 8, further, comprising a top metal interconnect layer formed over the thin film transistor.

10. An integrated circuit comprising:
    a substrate having active circuitry formed thereon;
    an interconnect layer formed over the substrate;
    a plurality of memory cells formed over the interconnect layer; and
    a transistor formed over the interconnect layer, the transistor for selectively coupling a memory cell of the plurality of memory cells to the active circuitry.

11. The integrated circuit of claim 10, wherein the transistor is a thin film transistor (TFT).

12. The integrated circuit of claim 10, wherein the active circuitry comprises an access circuit for coupling the plurality of memory cells to a data path.

13. The integrated circuit of claim 12 wherein the transistor is for coupling at least one of the plurality of memory cells to a data path in response to receiving a select signal from the access circuit.

14. The integrated circuit of claim 10, wherein the plurality of memory cells is characterized as being a plurality of magneto-resistive random access memory (MRAM) cells, each of the plurality of MRAM cells comprising a magneto tunnel junction (MTJ) storage element.

15. The integrated circuit of claim 14, wherein:
the active circuitry comprises an access circuit for coupling the plurality of memory cells to a data path;
the transistor is for coupling at least one of the plurality of memory cells to a data path in response to receiving a select signal from the access circuit;
the transistor has a first current electrode coupled to an MTJ storage element of at least one of the plurality of memory cells, a second current electrode coupled to a bitline, and a control electrode coupled to a wordline for receiving the select signal.

16. The integrated circuit of claim 14, wherein the transistor coupled to MTJ storage elements or more than one cells of the plurality of memory cells, the more than one cells are coupled together in parallel.

17. The integrated circuit of claim 10, wherein the interconnect layer is one of a plurality of metal interconnect layers formed over the substrate.

18. The integrated circuit of claim 17, further comprising a top metal interconnect layer formed over the transistor.

19. An integrated circuit comprising:
a substrate having active circuitry formed thereon, wherein the active circuitry includes a plurality of transistors;
an interconnect layer formed over the substrate including over the active circuitry; and
a transistor formed over the interconnect layer.

20. The integrated circuit of claim 19, wherein the transistor is a thin film resistor (TFT).

21. The integrated circuit of claim 19 wherein the plurality of transistor are CMOS transistors.

22. The integrated circuit of claim 19 wherein each of the plurality of transistors includes a source/drain region formed by doping material or the substrate.

* * * * *